(12) United States Patent
Wesemann et al.

(10) Patent No.: US 9,425,398 B2
(45) Date of Patent: Aug. 23, 2016

(54) COMPLEX COMPOUNDS HAVING ANIONIC LIGANDS CONTAINING TWO P DONORS AND THE USE THEREOF IN THE OPTO-ELECTRONIC FIELD

(75) Inventors: Lars Wesemann, Tübingen (DE); Hartmut Schubert, Bodelshausen (DE); Hermann August Mayer, Tübingen (DE); Hartmut Yersin, Sinzing (DE); Andreas Rausch, Haiming (DE)

(73) Assignee: Merck Patent GmbH, Darmstadt (DE)

( * ) Notice: Subject to any disclaimer, the term of this patent is extended or adjusted under 35 U.S.C. 154(b) by 173 days.

(21) Appl. No.: 14/234,857

(22) PCT Filed: Jul. 18, 2012

(86) PCT No.: PCT/EP2012/064126
§ 371 (c)(1),
(2), (4) Date: Jan. 24, 2014

(87) PCT Pub. No.: WO2013/014049
PCT Pub. Date: Jan. 31, 2013

(65) Prior Publication Data
US 2014/0203225 A1 Jul. 24, 2014

(30) Foreign Application Priority Data
Jul. 26, 2011 (DE) .................. 10 2011 079 847

(51) Int. Cl.
*H01L 51/00* (2006.01)
*C09K 11/06* (2006.01)
(Continued)

(52) U.S. Cl.
CPC ........... *H01L 51/0004* (2013.01); *C09K 11/06* (2013.01); *H01L 51/009* (2013.01);
(Continued)

(58) Field of Classification Search
CPC H01L 51/0091; H01L 51/0004; C09K 11/06
See application file for complete search history.

(56) References Cited

U.S. PATENT DOCUMENTS 6,963,005 B2  11/2005  Lecloux et al.
7,683,183 B2   3/2010  Peters et al.
(Continued)

FOREIGN PATENT DOCUMENTS

CN  101747375 A    6/2010
DE  102008033563 A1 1/2010
(Continued)

OTHER PUBLICATIONS

U.S. Appl. No. 14/234,809, filed Jan. 24, 2014, Wesemann et al.
(Continued)

*Primary Examiner* — Ling Choi
*Assistant Examiner* — Catherine S Branch
(74) *Attorney, Agent, or Firm* — Drinker Biddle & Reath LLP

(57) ABSTRACT

The invention describes electronic devices comprising a metal complex compound having at least one anionic ligand containing two P donors, having the formula (I), in which R1 to R4 are, independently of one another, an atom or radical from the group comprising hydrogen, a halogen, R, RO—, RS—, RCO—, RCOO—, RNH—, R2N—, RCONR— and —Si(R)X(OR)3-X, where R=a C1-C40-hydrocarbon and X=1, 2 or 3, and E is a bridge atom from the group with carbon or boron, where an atom or radical from the group with hydrogen, halogen, —CN, R, RO—, RS—, RCO—, RCOO—, RNH—, R2N—, RCONR— and —Si(R)X(OR) 3-X, where R=the C1-C40-hydrocarbon and X=1, 2 or 3, is optionally bonded to the carbon, and two radicals from the group with halogen, R, RO—, RS—, RCO—, RCOO—, RNH—, R2N—, RCONR— and —Si(R)X(OR)3-X, where R=the C1-C40-hydrocarbon and X=1, 2 or 3, are optionally bonded to the boron. The invention furthermore describes a process for the production of an electronic device of this type and processes for the generation of light or blue emission using a metal complex compound of this type.

16 Claims, 5 Drawing Sheets

(51) Int. Cl.
*H05B 33/14* (2006.01)
*H01L 51/50* (2006.01)

(52) U.S. Cl.
CPC ........... *H01L51/0091* (2013.01); *H05B 33/14* (2013.01); *C09K 2211/1096* (2013.01); *C09K 2211/183* (2013.01); *C09K 2211/185* (2013.01); *C09K 2211/188* (2013.01); *H01L 51/5016* (2013.01); *Y02E 10/549* (2013.01)

(56) References Cited

U.S. PATENT DOCUMENTS

| | | |
|---|---|---|
| 2002/0048689 A1 | 4/2002 | Igarashi et al. |
| 2005/0244672 A1 | 11/2005 | Che et al. |
| 2007/0111026 A1 | 5/2007 | Deaton et al. |
| 2007/0265473 A1 | 11/2007 | Becker et al. |
| 2008/0036370 A1 | 2/2008 | Noh et al. |
| 2010/0026174 A1 | 2/2010 | Igarashi et al. |
| 2010/0227974 A1 | 9/2010 | Schulte et al. |
| 2011/0108769 A1 | 5/2011 | Yersin et al. |
| 2011/0144366 A1* | 6/2011 | Stoessel ................ C09K 11/06 556/14 |
| 2011/0155954 A1 | 6/2011 | Yersin et al. |

FOREIGN PATENT DOCUMENTS

| | | |
|---|---|---|
| EP | 1424350 | 6/2004 |
| JP | 2003212886 A | 7/2003 |
| WO | WO-2004/041901 | 5/2004 |
| WO | WO-2005/118606 A1 | 12/2005 |
| WO | WO-2008/019744 A1 | 2/2008 |
| WO | WO-2010006681 A1 | 1/2010 |
| WO | WO-2011063083 A1 | 5/2011 |

OTHER PUBLICATIONS

U.S. Appl. No. 14/234,710, filed Jan. 24, 2014, Wesemann et al.
U.S. Appl. No. 14/234,781, filed Jan. 24, 2014, Wesemann et al.
Cheng, Yi-Ming, et al., "Rational Design of Chelating Phosphine Functionalized Os$^{(II)}$ Emitters and Fabrication of Orange Polymer Light-Emitting Diodes Using Solution Process", Adv. Funct. Mater., vol. 18, (2008), pp. 83-194.
Deaton, Joseph C., et al., "E-Type Delayed Fluorescence of a Phosphine-Supported Cu$_2$(µ-NAr$_2$)$_2$ Diamond Core: Harvesting Singlet and Triplet Excitons in OLEDsII", J. Am. Chem. Soc., vol. 132, (2010), pp. 9499-9508.
Kui, Steven C.F., et al., "Platinum(II) Complexes with □-Conjugated, Naphthyl-Substituted, Cyclometalated Ligands (RC$^{V \wedge}$N$^{□}$): Structures and Photo- and Electroluminescence", Chem. Eur. J., vol. 13, (2007), pp. 417-435.
Miller, Alexander J.M., et al., "Long-Lived and Efficient Emission from Mononuclear Amidophosphine Complexes of Copper", Inorganic Chemistry, vol. 46, No. 18, (2007), pp. 7244-7246.
Moudam, Omar, et al., "Electrophosphorescent Homo- and Heteroleptic Copper(I) Complexes Prepared from Various Bis-Phosphine Ligands", Chem. Commun., (2007), pp. 3077-3079.
International Search Report for PCT/EP2012/064126 mailed Oct. 10, 2012.

* cited by examiner

Wavelength (nm)

Wavelength (nm)

COMPLEX COMPOUNDS HAVING ANIONIC LIGANDS CONTAINING TWO P DONORS AND THE USE THEREOF IN THE OPTO-ELECTRONIC FIELD

CROSS-REFERENCE TO RELATED APPLICATIONS

This application is a national stage application (under 35 U.S.C. §371) of PCT/EP2012/064126, filed Jul. 18, 2012, which claims benefit of German application 10 2011 079 847.1, filed Jul. 26, 2011.

The present invention relates to electronic devices, such as organic electroluminescent devices (OLEDs), light-emitting electrochemical cells (LEECs), organic solar cells (OSCs), organic field-effect transistors and organic lasers, which comprise organotransition-metal complex compounds as light emitters and/or light absorbers. Some particularly suitable complex compounds and the use thereof in the opto-electronic field are described.

Organotransition-metal complex compounds are important building blocks for opto-electronic devices, such as organic solar cells or organic electroluminescent devices. This applies, in particular, to compounds which are able to function as triplet emitters. In the case of triplet emission, also known as phosphorescence, high internal quantum yields of up to 100% can be achieved if the singlet state, which is also excited and is energetically above the triplet state, is able to relax completely into the triplet state and radiation-free competing processes remain un-important. However, many triplet emitters which are basically suitable for opto-electronic applications have the disadvantage of a long emission lifetime, which can result in a drop in efficiency, for example in OLED devices provided with emitters of this type.

Yersin et al. in WO 2010/006681 A1 have proposed organotransition-metal compounds which have a very small energetic separation $\Delta E$ between the lowest triplet state and the higher singlet state and in which efficient re-occupation from the efficiently occupied $T_1$ state into the $S_1$ state can therefore already occur at room temperature. This re-occupation opens a fast emission channel from the short-lived $S_1$ state, which enables the total emission lifetime to be significantly reduced. Complexes containing metal centres having a $d^8$-electron configuration, i.e., in particular, based on the very expensive metals rhodium, iridium, palladium, platinum and gold, have been described as particularly suitable for this purpose.

The present invention was based on the object of providing organo-transition-metal complex compounds based on readily available and very inexpensive transition metals which are ideally at least equal to the organotransition-metal complex compounds known from WO 2010/006681 in their physical properties, such as colour purity, emission decay time and quantum efficiency.

The present invention relates to the electronic device comprising a metal complex compound having at least one anionic ligand containing two P donors, having the formula I
in which

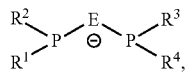

$R^1$ to $R^4$ are, independently of one another, an atom or radical from the group comprising hydrogen, a halogen, R—, RO—, RS—, RCO—, RCOO—, RNH—, $R_2$N—, RCONR— and —Si(R)$_x$(OR)$_{3-x}$, where R=a $C_1$-$C_{40}$-hydrocarbon and X=1, 2 or 3, and E is a carbon or a boron, where
  an atom or radical from the group with hydrogen, halogen, —CN, R—, RO—, RS—, RCO—, RCOO—, RNH—, $R_2$N—, RCONR— and —Si(R)$_x$(OR)$_{3-x}$, where R=the $C_1$-$C_{40}$-hydrocarbon and X=1, 2 or 3, is optionally bonded to the carbon, and
  two radicals from the group with halogen, R—, RO—, RS—, RCO—, RCOO—, RNH—, $R_2$N—, RCONR— and —Si(R)$_x$(OR)$_{3-x}$, where R=the $C_1$-$C_{40}$-hydrocarbon and X=1, 2 or 3, are optionally bonded to the boron.

The present invention likewise relates to a process for the generation of light of a certain wavelength, comprising the step of the provision of a metal complex compound having a ligand containing P donors of the formula I and a process for the generation of blue emission using a metal complex having a compound having a ligand containing P donors of the formula I and a process for the production of an electronic device according to one of the preceding claims, characterised in that the metal complex compound having the at least one anionic ligand of the formula I is printed onto a substrate.

Preferred embodiments of the device according to the invention are a) characterised in that the $C_1$- to $C_{40}$-hydrocarbon R is an alkyl, cycloalkyl, alkenyl, cycloalkenyl, alkynyl, cycloalkynyl, alkylcycloalkyl, heteroalkyl, heterocycloalkyl, heteroalkylcycloalkyl, aryl, heteroaryl, aralkyl or heteroaralkyl radical, each of which may, in preferred embodiments, have one or more halogen, hydroxyl, thiol, carbonyl, keto, carboxyl, cyano, sulfone, nitro, amino and/or imino functions;

b) characterised in that at least one of the two P is a ring atom of a ring system of an aromatic or non-aromatic nature (which includes the radicals $R^1$ and $R^2$ and/or $R^3$ and $R^4$);

c) characterised in that the metal complex compound is mononuclear or polynuclear, preferably has one to six metal centres;

d) characterised in that the metal complex compound includes at least one of the metals Cu, Ag, Au, Pd, Pt, Rh, Ir, Re, Os, Mo, W and Zn in preferably ionic form;

e) characterised in that the metal complex compound includes a Cu or Ag ion and at least one further metal from the group with Cu, Ag, Au, Pd, Pt, Rh, Ir, Re, Os, Mo, W or Zn;

f) characterised in that the metal complex compound has the formula II
in which

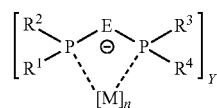

$R^1$ to $R^4$ and E are defined as in formula I,
[M]$_n$ represents a complex fragment where M=at least one metal from the group with Cu, Ag, Au, Pd, Pt, Rh, Ir, Re, Os, Mo, W and Zn,
n is equal to 1 or a higher integer and
y is equal to 1, 2 or 3;

g) characterised in that the metal complex compound has a ΔE separation between the lowest triplet state and the higher singlet state of between 50 cm$^{-1}$ and 3000 cm$^{-1}$;
h) selected from the group consisting of organic electroluminescent devices (OLEDs), light-emitting electrochemical cells (LEECs), organic solar cells (OSCs), organic field-effect transistors and organic lasers;
i) characterised in that it comprises the metal complex compound as constituent of an emitter layer, where the proportion of the metal complex in the emitter layer is preferably between 0.1 and 50% by weight and
j) characterised in that it comprises the metal complex compound as constituent of an absorber layer, where the proportion of the metal complex in the absorber layer is preferably between 30 and 100% by weight.

The wording of all claims is hereby incorporated into this description by way of reference.

Figure 1:
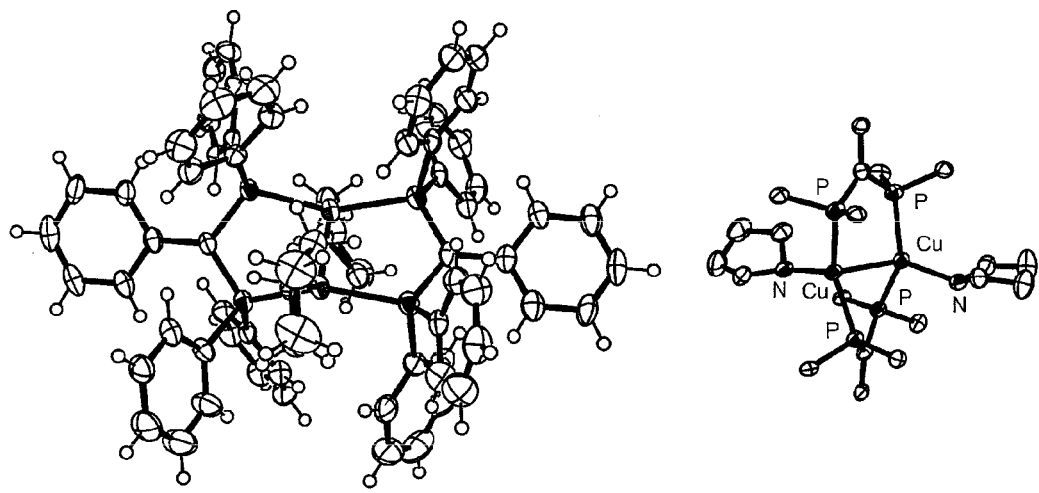
FIG. 1 shows the structure of the dinuclear copper complex (1), determined from X-ray structure data.

An electronic device according to the invention is distinguished by the fact that it comprises a metal complex compound having at least one anionic ligand containing two P donors (P=phosphorus), having the formula I in which

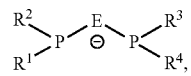

$R^1$ to $R^4$ are, independently of one another, an atom or radical from the group comprising hydrogen, a halogen, R—, RO—, RS—, RCO—, RCOO—, RNH—, R$_2$N—, RCONR— and —Si(R)$_X$(OR)$_{3-X}$, where R=a C$_1$-C$_4$-hydrocarbon and X=1, 2 or 3, and E is a carbon, to which an atom or radical from the group with hydrogen, halogen, —CN, R—, RO—, RS—, RCO—, RCOO—, RNH—, R$_2$N—, RCONR— and —Si(R)$_X$(OR)$_{3-X}$, where R=the C$_1$-C$_{40}$-hydrocarbon and X=1, 2 or 3, is optionally bonded, or E is a boron, to which two radicals from the group with halogen, R—, RO—, RS—, RCO—, RCOO—, RNH—, R$_2$N—, RCONR— and —Si(R)$_X$(OR)$_{3-X}$, where R=the C$_1$-C$_{40}$-hydrocarbon and X=1, 2 or 3, are optionally bonded.

The ligand thus preferably has a negative charge, which may be localised on the E or may also be delocalised. In preferred embodiments, E is thus a carbanionic fragment containing a trivalent carbon or an alkyl borate fragment containing a tetravalent boron.

In preferred embodiments, E and one or even both P may be part of an electron system via which the negative charge is delocalised. The delocalisation of the electrons may optionally also extend to the bonded radicals $R^1$ to $R^4$ and to radicals bonded to E if these contain conjugated double bonds or are of an aromatic nature.

The C$_1$- to C$_{40}$-hydrocarbon R is preferably an alkyl, cycloalkyl, alkenyl, cycloalkenyl, alkynyl, cycloalkynyl, alkylcycloalkyl, heteroalkyl, heterocycloalkyl, heteroalkylcycloalkyl, aryl, heteroaryl, aralkyl or heteroaralkyl radical. In preferred embodiments, each of these radicals may have one or more halogen, hydroxyl, thiol, carbonyl, keto, carboxyl, cyano, sulfone, nitro, amino and/or imino functions.

The expression alkyl radical relates, in particular, to a saturated, straight-chain or branched hydrocarbon group which has 1 to 20 carbon atoms, preferably 1 to 12 carbon atoms, particularly preferably 1 to 6 carbon atoms. Examples thereof are the methyl, ethyl, propyl, isopropyl, iso-butyl, t-butyl, n-hexyl, 2,2-dimethylbutyl or n-octyl group.

The expressions alkenyl and alkynyl radical relate, in particular, to at least partially unsaturated, straight-chain or branched hydrocarbon groups which have 2 to 20 carbon atoms, preferably 2 to 12 carbon atoms, particularly preferably 2 to 6 carbon atoms. Examples thereof are the ethenyl, allyl, acetylenyl, propargyl, isoprenyl or hex-2-enyl group.

The expressions cycloalkyl, cycloalkenyl and cycloalkynyl radical relate, in particular, to saturated or partially unsaturated cyclic groups which have one or more rings which have, in particular, 3 to 14 ring carbon atoms, particularly preferably 3 to 10 ring carbon atoms. Examples thereof are the cyclopropyl, cyclohexyl, tetralin or cyclohex-2-enyl group.

The expression heteroalkyl radical relates, in particular, to an alkyl, an alkenyl or an alkynyl group in which one or more (preferably 1, 2 or 3) carbon atoms or CH or CH$_2$ groups have been replaced by an oxygen, nitrogen, phosphorus and/or sulfur atom. Examples thereof are alkyloxy groups, such as methoxy or ethoxy, or tertiary amine structures.

The expression heterocycloalkyl radical relates, in particular, to a cycloalkyl, cycloalkenyl or cycloalkynyl group in which one or more (preferably 1, 2 or 3) ring carbon atoms or ring CH or $CH_2$ groups have been replaced by an oxygen, nitrogen, phosphorus and/or sulfur atom, and can stand, for example, for the piperidine or N-phenylpiperazine group.

The expression aryl radical relates, in particular, to an aromatic group which has one or more rings which contain, in particular, 5 or 6 to 14 ring carbon atoms, particularly preferably 5 or 6 to 10 ring carbon atoms. Examples thereof are a phenyl, naphthyl or 4-hydroxyphenyl group.

The expression heteroaryl radical relates, in particular, to an aryl group in which one or more (preferably 1, 2 or 3) ring carbon atoms or ring CH or $CH_2$ groups have been replaced by an oxygen, nitrogen, phosphorus and/or sulfur atom. Examples thereof are the 4-pyridyl, 2-imidazolyl or the 3-pyrazolyl group.

The expressions aralkyl or heteroaralkyl radical relate, in particular, to groups which, in accordance with the above definitions, contain both aryl and/or heteroaryl groups and also alkyl, alkenyl, alkynyl or heteroalkyl groups. Examples thereof are arylalkyl, arylalkenyl, arylalkynyl, aryl-heteroalkyl, arylheteroalkenyl, arylheteroalkynyl, heteroarylheteroalkyl, heteroarylheteroalkenyl, heteroarylheteroalkynyl, arylcycloalkyl, hetero-arylcycloalkyl, arylheterocycloalkyl, heteroarylheterocycloalkyl, heteroarylcycloalkenyl, arylcycloalkenyl, arylcycloalkynyl, heteroarylcyclo-alkynyl, arylheteroalkenyl, heteroarylheteroalkenyl, arylheteroalkynyl, heteroarylheteroalkynyl, heteroarylalkyl, heteroalkenyl and heteroaryl-alkynyl groups.

The expressions alkylcycloalkyl or heteroalkylcycloalkyl radical relate to groups which, in accordance with the above definitions, contain both cycloalkyl or heterocycloalkyl and also alkyl, alkenyl, alkynyl and/or heteroalkyl groups. Examples of such groups are alkylcycloalkyl, alkenylcycloalkyl, alkynylcycloalkyl, alkylheterocycloalkyl, alkenyl-hetero-cycloalkyl, alkynylheterocycloalkyl, heteroalkylcycloalkyl, heteroalkenyl-cycloalkyl, heteroalkylheterocycloalkyl, heteroalkenylheterocycloalkyl, heteroalkynylcycloalkyl, and heteroalkynylheterocycloalkyl groups.

A silyl radical for the purposes of the present invention is taken to mean, in particular, a group of the general formula $Si(R)_X(OR)_{3-X}$ described above, where X=1, 2 or 3, where R is preferably an alkyl, cycloalkyl, alkenyl, cycloalkenyl, alkynyl, cycloalkynyl, alkylcycloalkyl, heteroalkyl, heterocycloalkyl, heteroalkylcycloalkyl, aryl, heteroaryl, aralkyl or heteroaralkyl radical, as has been defined above. Examples of the silyl radicals which may be mentioned are —$Si(OMe)_3$, —$Si(Me)_3$, —$SiMe_2(OMe)$, —$Si(OPh)_3$, —$Si(Ph)_3$, —$SiMe_2(OPh)$, —$Si(OEt)_3$, —$Si(Et)_3$, —$SiMe(OEt)_2$, —$SiMe_2(OEt)$, —$Si(OPr)_3$, —$Si(Pr)_3$, —$SiMe_2(OPr)$, —$SiEt(OMe)_2$, —$SiEt_2(OMe)$, —$SiPh(OMe)_2$, —$SiPh_2(OMe)$, —$SiMe_2(OC(O)Me)$, —$SiMe(O—N=CMe_2)_2$ oder —$SiMe_2(O—N=CMe_2)$, where the abbreviations Me stand for methyl, Ph for phenyl, Et for ethyl and Pr for iso- or n-propyl.

In particularly preferred embodiments, at least one of the two P is a ring atom of a ring system of an aromatic or non-aromatic nature. In this case, $R^1$ and $R^2$ as well as $R^3$ and $R^4$ are fragments of the corresponding ring system. $R^1$ and $R^2$ and/or $R^3$ and $R^4$ together with the corresponding P then form a heterocycloalkyl, heteroaryl, heteroaralkyl or heteroalkylcycloalkyl radical or at least part of one such, as is defined above. Examples thereof are 5- and 6-membered ring systems, as depicted below, where hydrogen, halogen or the $C_1$- to $C_{40}$-hydrocarbon R described above are preferably in the formulae R', R'', R''', independently of one another:

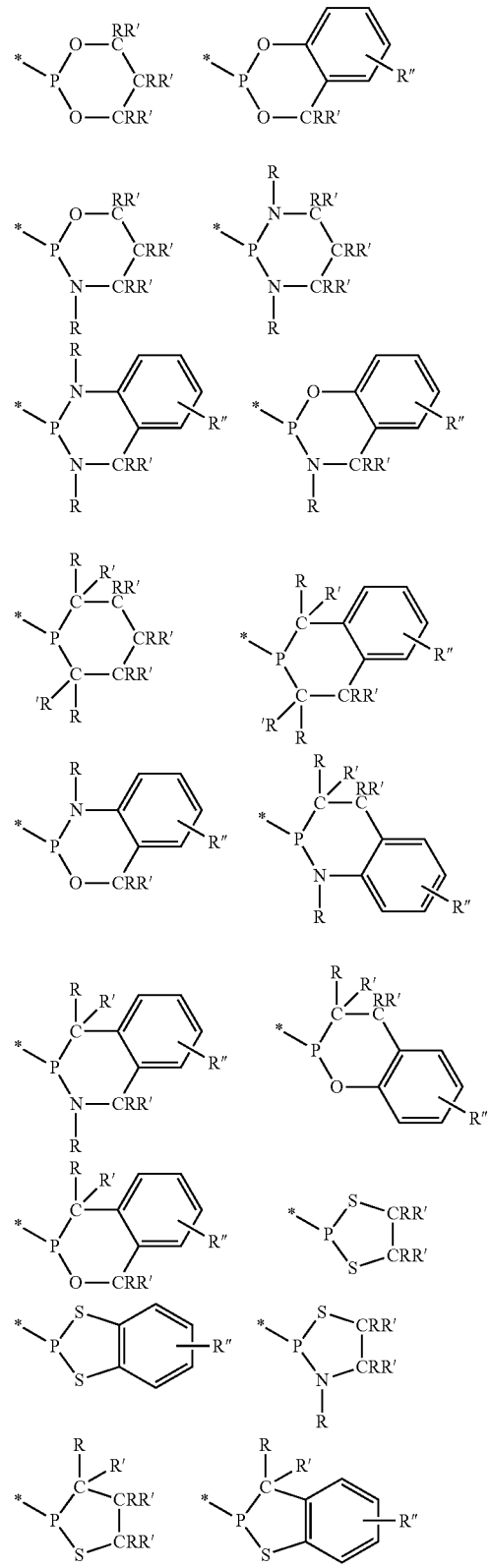

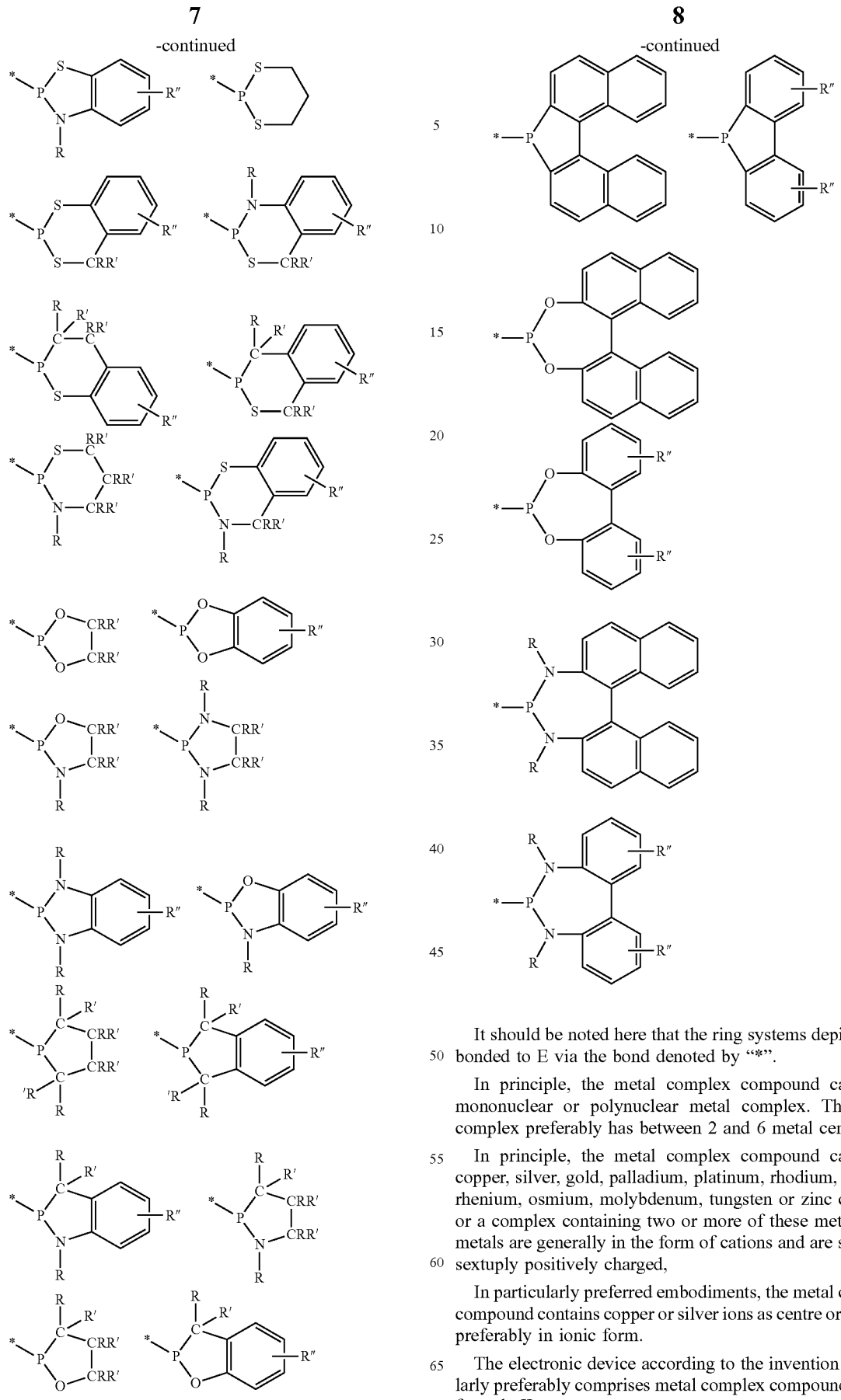

It should be noted here that the ring systems depicted are bonded to E via the bond denoted by "*".

In principle, the metal complex compound can be a mononuclear or polynuclear metal complex. The metal complex preferably has between 2 and 6 metal centres.

In principle, the metal complex compound can be a copper, silver, gold, palladium, platinum, rhodium, iridium, rhenium, osmium, molybdenum, tungsten or zinc complex or a complex containing two or more of these metals. The metals are generally in the form of cations and are singly to sextuply positively charged, In particularly preferred embodiments, the metal complex compound contains copper or silver ions as centre or centres, preferably in ionic form.

The electronic device according to the invention particularly preferably comprises metal complex compounds of the formula II

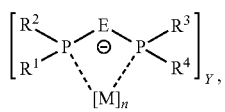

in which

R¹ to R⁴ and E are defined as in formula I and

[M]$_n$ represents a complex fragment, where M=Cu, Ag, Au, Pd, Pt, Rh, Ir, Re, Os, Mo, W or Zn and n=1 or a larger integer, in particular an integer from 1 to 6, and y is equal to 1, 2 or 3.

The variable n is particularly preferably 1, i.e. metal complex compounds of the formula II are preferably a mononuclear complex compound.

If n is >1, M preferably includes Cu or Ag and at least one further metal from the group with Cu, Ag, Au, Pd, Pt, Rh, Ir, Re, Os, Mo, W and Zn.

Potential coordination possibilities between the metal centre [M]$_n$ and the donors P are depicted as dashed lines.

Free valences of [M]$_n$ are if necessary saturated by bridging and/or non-bridging ligands.

Non-bridging ligands in the present case are intended to be taken to mean ligands which do not bond simultaneously to two or more metal centres. Even though such ligands are not structure-forming, they may have a great influence on the separations between the metal centres of a polynuclear complex in that they increase or reduce the electron densities at the metal centres. The ligands are important for the saturation of the coordination sphere of the metal or for charge equalisation or for both. These ligands can therefore be neutral or anionic. Furthermore, the ligands can be monodentate or bidentate.

Suitable neutral, monodentate ligands are preferably selected from the group with carbon monoxide, nitrogen monoxide, nitriles (RCN), iso-nitriles (RNC), such as, for example, t-butyl isonitrile, cyclohexyl isonitrile, adamantyl isonitrile, phenyl isonitrile, mesityl isonitrile and 2,6-dimethylphenyl isonitrile, ethers, such as, for example, dimethyl ether and diethyl ether, selenides, amines, such as, for example, trimethyl-amine, triethylamine and morpholine, imines (RN=CR'), phosphines, such as, for example, triphenylphosphine, phosphites, such as, for example, trimethyl phosphite, arsines, such as, for example, trifluoroarsine, trimethylarsine and triphenylarsine, stibines, such as, for example, trifluorostibine or triphenylstibine, and nitrogen-containing heterocycles, such as, for example, pyridine, pyridazine, pyrazine, pyrimidine and triazine.

Suitable anionic, monodentate ligands are preferably selected from the group with hydride, deuteride, the halides F, Cl, Br and I, azide, alkyl-acetylides, aryl- or heteroarylacetylides, alkyl, aryl and heteroaryl, as have been defined above, hydroxide, cyanide, cyanate, isocyanate, thio-cyanate, isothiocyanate, aliphatic or aromatic alcoholates, such as, for example, methanolate, ethanolate, propanolate and phenolate, aliphatic or aromatic thioalcoholates, such as, for example, methanethiolate, ethanethiolate, propanethiolate and thiophenolate, amides, such as, for example, dimethylamide, diethylamide and morpholide, carboxylates, such as, for example, acetate, trifluoroacetate, propionate and benzoate, anionic, nitrogen-containing heterocycles, such as, for example, pyrrolide, imidazolide, pyrazolide, aliphatic and aromatic phosphides or aliphatic or aromatic selenides.

Suitable di- or trianionic ligands are, for example, $O^{2-}$, $S^{2-}$ or $N^{3-}$.

Neutral or mono- or dianionic bidentate ligands which are suitable as ligand are preferably selected from the group with diamines, such as, for example, ethylenediamine, N,N,N',N'-tetramethylethylenediamine, propylenediamine, N,N, N',N'-tetramethylpropylenediamine, cis- or trans-diaminocyclohexane, cis- or trans-N,N,N', N'-tetramethyldiaminocyclo-hexane, imines, such as, for example, 2-[1-(phenylimino)ethyl]pyridine, 2-[1-(2-methylphenylimino)ethyl]pyridine or 2-[1-(ethylimino)ethyl]pyridine, diimines, such as, for example, 1,2-bis(methylimino)ethane, 1,2-bis(ethylimino)ethane, 1,2-bis(isopropylimino)ethane, 2,3-bis(methyl-imino)butane, 2,3-bis(isopropylimino)butane or 1,2-bis(2-methylphenyl-imino)ethane, heterocycles containing two nitrogen atoms, such as, for example, 2,2'-bipyridine or o-phenanthroline, diphosphines, such as, for example, bis(diphenylphosphino)methane, bis(diphenylphosphino)-ethane, bis(dimethylphosphino)methane, bis(dimethylphosphino)ethane, bis(diethylphosphino)methane or bis(diethylphosphino)ethane, 1,3-diketonates derived from 1,3-diketones, such as, for example, acetyl-acetone, benzoylacetone, 1,5-diphenylacetylacetone, dibenzoylmethane and bis(1,1,1-trifluoroacetyl)methane, 3-ketonates derived from 3-keto-esters, such as, for example, ethyl acetoacetate, carboxylates derived from aminocarboxylic acids, such as, for example, pyridine-2-carboxylic acid, quinoline-2-carboxylic acid, glycine, N,N-dimethylglycine, alanine, N,N-dimethylaminoalanine, salicyliminates derived from salicylimines, such as, for example, methylsalicylimine, ethylsalicylimine, phenylsalicyl-imine, dialcoholates derived from dialcohols, such as, for example, ethylene glycol, 1,3-propylene glycol and dithiolates derived from dithiols, such as, for example, 1,2-ethylenedithiol and 1,3-propylene-dithiol.

It is furthermore also possible to employ bidentate monoanionic ligands which, with the metal, have a cyclometallated five-membered ring or six-membered ring having at least one metal-carbon bond, in particular a cyclometallated five-membered ring. These are, in particular, ligands as are generally used in the area of phosphorescent metal complexes for organic electroluminescent devices, i.e. ligands of the phenylpyridine, naphthylpyridine, phenylquinoline, phenylisoquinoline, etc., type, each of which may be substituted or unsubstituted. A multiplicity of such ligands are known to the person skilled in the art in the area of phosphorescent electroluminescent devices, and he will be able to select further ligands of this type as ligand without inventive step.

Bridging ligands in the present case are intended to be taken to mean ligands which bond simultaneously to two or more metal centres and are thus structure-forming. These are thus used, in particular, if the complex used in accordance with the invention is a polynuclear complex. Suitable bridging ligands generally contain at least two donor groups and one bridge fragment connecting the donor groups. The donor group is an atom or an atom group which bonds to the metal atom. The two donor groups may be identical or different, i.e. asymmetrical ligands may also be used Bridging ligands may also be either neutral or anionic. In the latter case, either the donor groups carry a negative charge or the bridge fragment.

Neutral, bridging ligands contain as donor groups, in particular, groups from the series with R$_2$N—, R$_2$P—, R$_2$As—, R$_2$N—, CN—, NC—, RO—, RS—, RSe— and RN=. ("—" or "=" denotes the bonding mode by means of which the donor group is bonded to the bridge, R preferably a C$_1$- to C$_{40}$-hydrocarbon, as has been defined above). Suitable as bridge fragment is likewise a hydrocarbon as has already been described, preferably having a maximum of 6 C atoms.

In the case of anionic, bridging ligands, one or both donor groups are negatively charged, or the bridge fragment carries the charge. Frequently used anionic donor groups are: O—, NR— or C≡C—. Examples of anionic, bridging ligands are, for example,

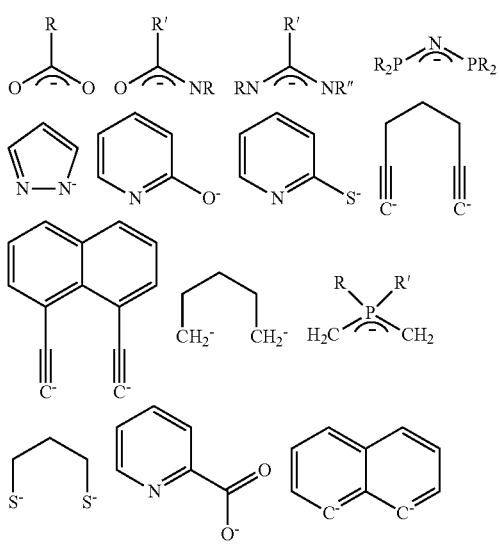

In these formulae, R and R' preferably stand for the $C_1$-$C_{40}$ hydrocarbon defined above.

The metal complex of the formula III may be mentioned as illustrative of a particularly preferred polynuclear complex in which two metal centres M are connected via bridging ligands:

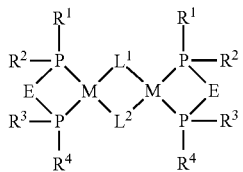

In this formula, $R^1$ to $R^4$, M and E are defined as in formula II. The ligands $L^1$ and $L^2$ are bridging ligands.

The metal complexes selected are particularly preferably organic transition-metal compounds which have a ΔE separation between the lowest triplet state and the higher singlet state of between 50 cm$^{-1}$ and 3000 cm$^{-1}$, i.e. have the same properties in this respect as the complexes described in WO 2010/006681. Regarding the calculation or measurement of the energy separation ΔE, reference is made to the statements in this respect in WO 2010/006681.

The device according to the invention is, in particular, a device from the group consisting of organic electroluminescent devices (OLEDs), light-emitting electrochemical cells (LEECs), organic solar cells (OSCs), organic field-effect transistors and organic lasers. Further fields of application which come into question are OLED sensors, in particular gas and vapour sensors which are not hermetically shielded from the out-side.

In particular if the electronic device according to the invention is an organic electroluminescent device, it is preferred for the device to comprise the metal complex compound as constituent of an emitter layer. The proportion of the metal complex in the emitter layer is in this case preferably between 0.1 and 50% by weight.

As is known, OLEDs are built up from a plurality of layers. A layer-like anode, for example consisting of indium tin oxide (ITO), is usually located on a substrate, such as a glass sheet. A hole-transport layer (HTL) is arranged on this anode. A layer of PEDOT/PSS (poly(3,4-ethylenedioxythiophene)polystyrene sulfonate), which serves to lower the injection barrier for holes and prevents indium from diffusing into the junction, may optionally also be located between the anode and the hole-transport layer. The emitter layer, which in the present case comprises the metal complex compound described above having the at least one anionic ligand, is very generally applied to the hole-transport layer. Under certain circumstances, the emitter layer may also consist of this complex. Finally, an electron-transport layer (ETL) is applied to the emitter layer. A cathode layer, for example consisting of a metal or metal alloy, is in turn applied thereto by vapour deposition in a high vacuum. As protective layer and in order to reduce the injection barrier for electrons, a thin layer of lithium fluoride, caesium fluoride or silver may optionally also be applied between cathode and the ETL by vapour deposition.

In operation, the electrons (=negative charge) migrate from the cathode in the direction of the anode, which provides the holes (=positive charge). In the ideal case, holes and electrons meet in the emitter layer, which is why this is also called the recombination layer. Electrons and holes form a bonded state, which is called exciton. A metal complex compound, such as that described in the present case, can be excited by an exciton by energy transfer. This can be converted into the ground state and can emit a photon in the process. The colour of the emitted light depends on the energy separation between excited state and ground state and can be varied in a targeted manner by variation of the complex or complex ligands.

In particular if the device according to the invention is an organic solar cell, it is preferred for the device to comprise the metal complex compound as constituent of an absorber layer, where the proportion of the metal complex compound in the absorber layer is preferably between 30 and 100% by weight. An organic solar cell is a solar cell which consists at least predominantly of organic materials, i.e. of hydrocarbon compounds.

As in the case of OLEDs, two electrodes are also provided in organic solar cells. The absorber layer, in which the metal complex described in the present application is used, is arranged between these.

As already mentioned, the metal complex compounds described in the present case can emit light. By variation of the ligands, the ΔE separation between the lowest triplet state the higher singlet state can be varied, so that it is in principle possible to set the wavelength of the emitted light to defined values, in particular also to very short-wave values, so that blue light is emitted. In particular with copper complexes which have the complex ligand described, excellent results have been achieved in this respect. Correspondingly, the present invention also encompasses a process for the generation of light of a certain wavelength or for the generation of blue emission, where in both cases the metal complex compound described having the ligand described is provided and used.

The complex compounds described are generally very readily soluble in organic solvents, such as benzene or toluene. This opens up the possibility of printing basically any desired substrate with the complex compounds. Correspondingly, the present invention also relates to a process for the production of an electronic device as described above, in which the metal complex compound described having the at least one anionic ligand of the formula I is printed onto a substrate.

Further features of the invention arise from the following description of preferred embodiments. It should be explicitly emphasised at this point that all optional aspects of the devices according to the invention or the processes according to the invention described in the present application can, in an embodiment of the invention, each be achieved individually or in combination with one or more of the further optional aspects described. The following description of preferred embodiments serves merely for explanation and for better understanding of the invention and should in no way be understood as restrictive.

WORKING EXAMPLES

Complex compounds having the following formulae were synthesised:

$$[Cu_2(Ph_2PCPhPPh_2)_2(NC_4H_8)_2] \quad (1)$$

$$[Cu(Ph_2PCPhPPh_2)(Ph_2PC_6H_4PPh_2)] \quad (2)$$

$$[Cu(Ph_2PCPhPPh_2)(dppbe)] \quad (3)$$

$$[Cu(Ph_2PCPhPPh_2)(PN)] \quad (4)$$

$$[\{Cu(Ph_2PCPhPPh_2)(dmpm)\}_2] \quad (5)$$

$$[\{Cu(Ph_2PCPhPPh_2)(dmpe)\}_2] \quad (6)$$

$$[Cu_2\{PPh_2C(CN)PPh_2\}_2\text{-phen}_2] \quad (7)$$

$$[Ag\{PPh_2C(CN)PPh_2\}_n] \quad (8)$$

$$[Au_2[PPh_2C(CN)PPh_2\}_2] \quad (9)$$

$$[Cu_2\{PPh_2C(Ph)PPh(C_6H_4NMe_2)\}_2] \quad (10)$$

The structure of the dinuclear copper complex (1), determined from X-ray structure data, is depicted in FIG. 1. The complete molecular structure is shown on the left, while only the skeleton of the complex without hydrogen atoms and without phenyl groups is shown on the right.

Figure 2:
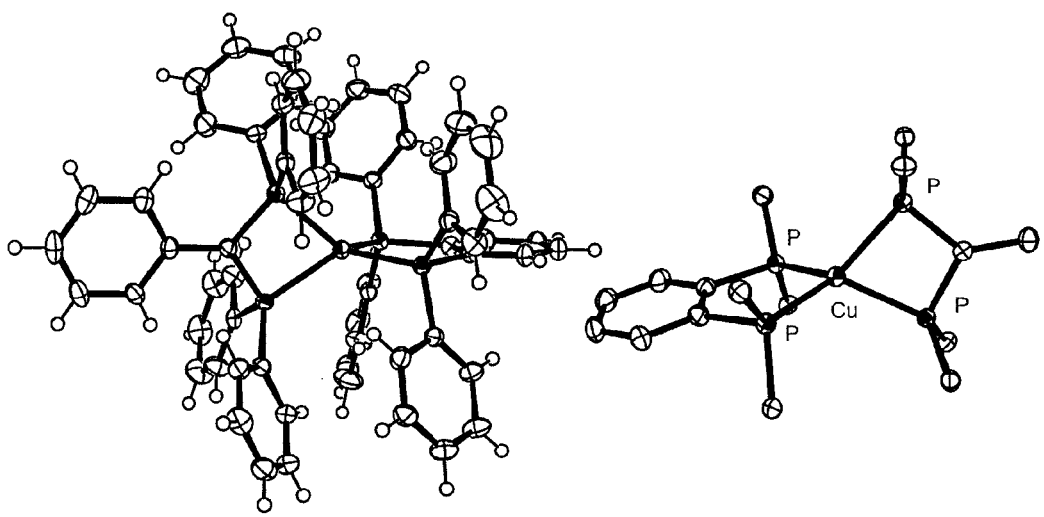
FIG. 2 shows the structure of the mononuclear copper complex (2), determined from X-ray structure data.

The structure of the mononuclear copper complex (2), determined from X-ray structure data, is depicted in FIG. 2. The complete molecular structure is shown on the left, while only the skeleton of the complex without hydrogen atoms and without phenyl groups is shown on the right.

Figure 3:
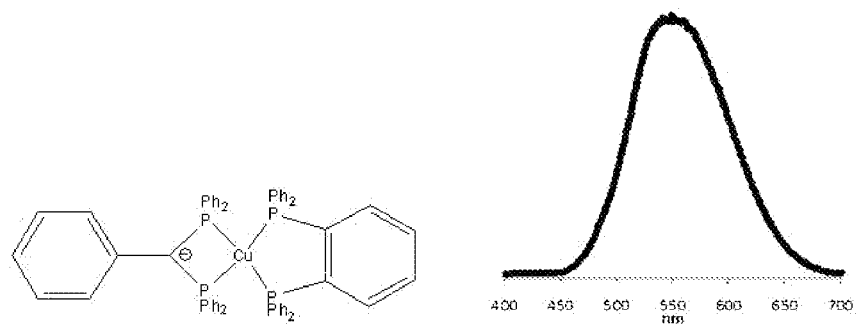
FIG. 3 shows on the left the structural formula of the mononuclear copper complex (3), where dppbe stands for the bidentate ligand 1,2-bis-(diphenylphosphinobenzene)ethane. The emission spectrum of the complex with an intensity maximum at about 550 nm is shown on the right.

FIG. 3 shows on the left the structural formula of the mononuclear copper complex (3), where dppbe stands for the bidentate ligand 1,2-bis-(diphenylphosphinobenzene) ethane. The emission spectrum of the complex with an intensity maximum at about 550 nm is shown on the right.

Figure 4:
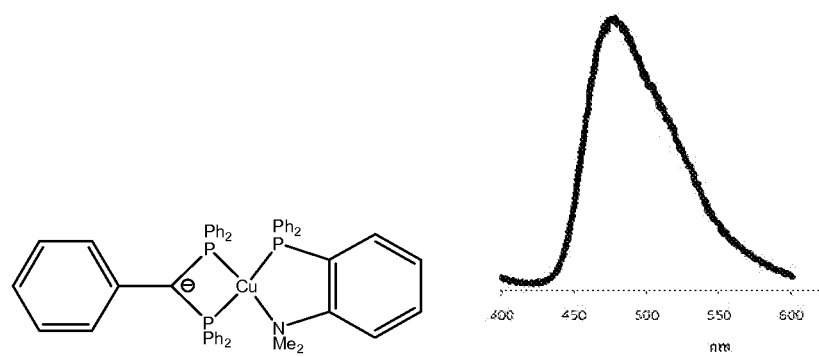
FIG. 4 shows on the left the structural formula of the mononuclear copper complex (4). The emission spectrum of the complex with an intensity maximum at about 480 nm is shown on the right.

FIG. 4 shows on the left the structural formula of the mononuclear copper complex (4). The emission spectrum of the complex with an intensity maximum at about 480 nm is shown on the right.

Figure 5:
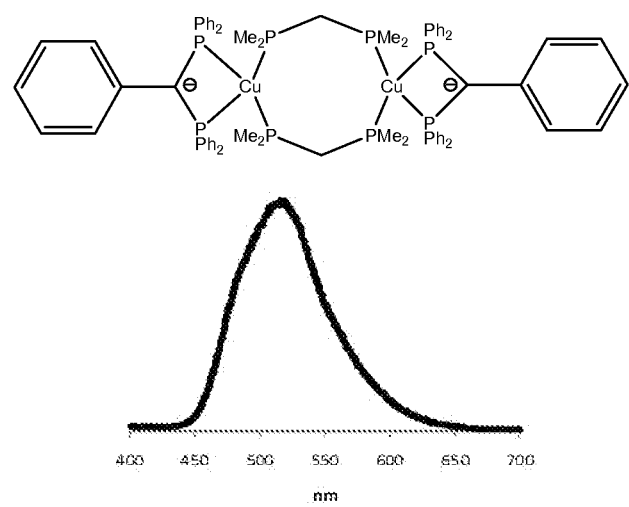
FIG. 5 shows at the top the structural formula of the dinuclear copper complex (5), where dmpm stands for the bidentate ligand bis(dimethyl-phosphino)methane. The emission spectrum of the complex with an intensity maximum at about 520 nm is shown at the bottom.

FIG. 5 shows at the top the structural formula of the dinuclear copper complex (5), where dmpm stands for the bidentate ligand bis(dimethyl-phosphino)methane. The emission spectrum of the complex with an intensity maximum at about 520 nm is shown at the bottom.

Figure 6:
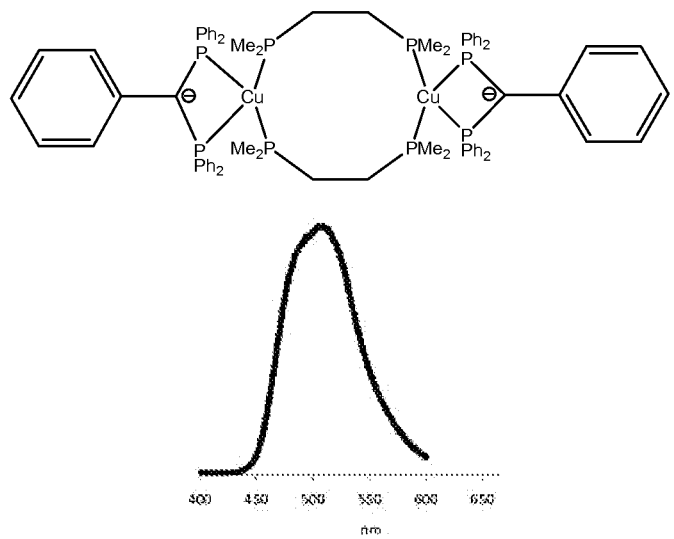
FIG. 6 shows at the top the structural formula of the dinuclear copper complex (6), where dmpe stands for the bidentate ligand bis(dimethyl-phosphino)ethane. The emission spectrum of the complex with an intensity maximum at about 515 nm is shown at the bottom.

FIG. 6 shows at the top the structural formula of the dinuclear copper complex (6), where dmpe stands for the bidentate ligand bis(dimethyl-phosphino)ethane. The emission spectrum of the complex with an intensity maximum at about 515 nm is shown at the bottom.

Figure 7:
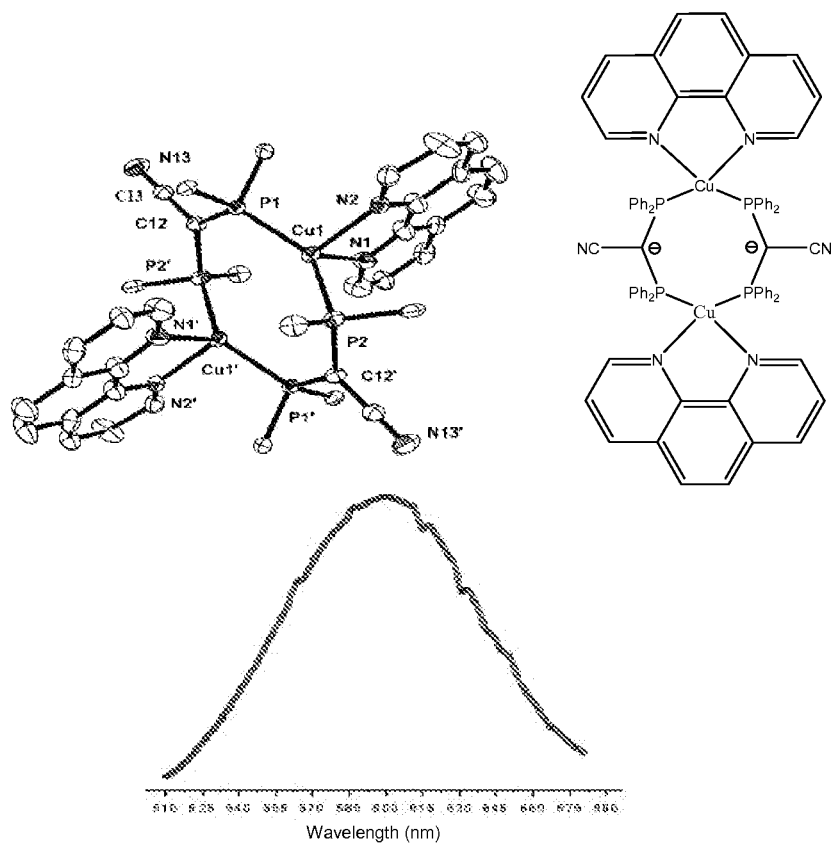
FIG. 7 shows at top left the structure of the dinuclear copper complex (7), determined from X-ray structure data, where phen stands for the bidentate ligand phenanthroline. The structural formula is depicted at top right. The emission spectrum of the complex with an intensity maximum at about 515 nm is shown at the bottom.

FIG. 7 shows at top left the structure of the dinuclear copper complex (7), determined from X-ray structure data, where phen stands for the bidentate ligand phenanthroline. The structural formula is depicted at top right. The emission spectrum of the complex with an intensity maximum at about 515 nm is shown at the bottom.

Figure 8:
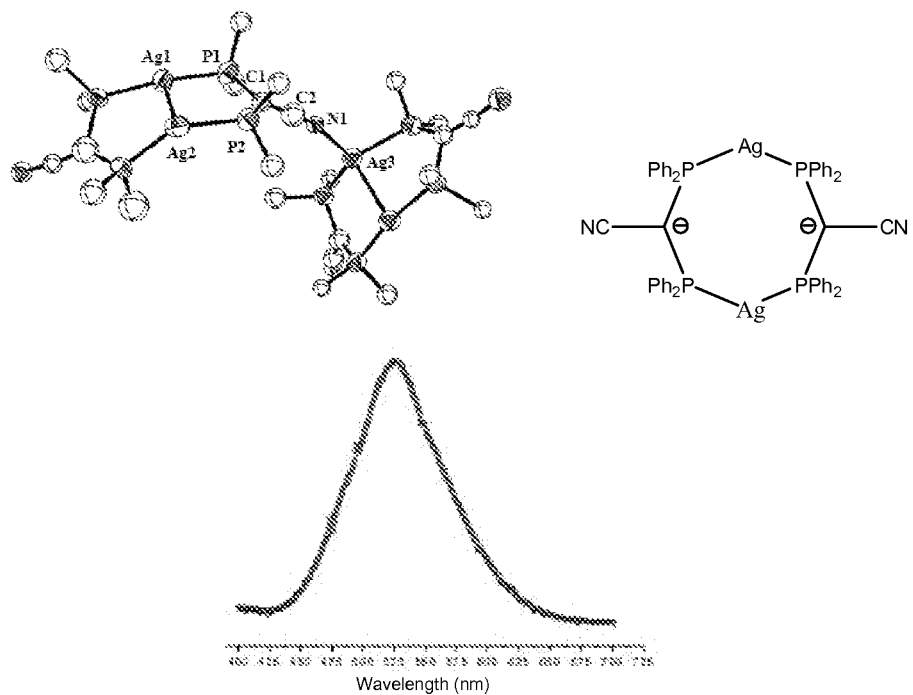
FIG. 8 shows at top left the structure of the dinuclear silver complex (8), determined from X-ray structure data. The structural formula is depicted at top right. The emission spectrum of the complex with an intensity maximum at about 525 nm is shown at the bottom.

FIG. 8 shows at top left the structure of the dinuclear silver complex (8), determined from X-ray structure data. The structural formula is depicted at top right. The emission spectrum of the complex with an intensity maximum at about 525 nm is shown at the bottom.

Figure 9:
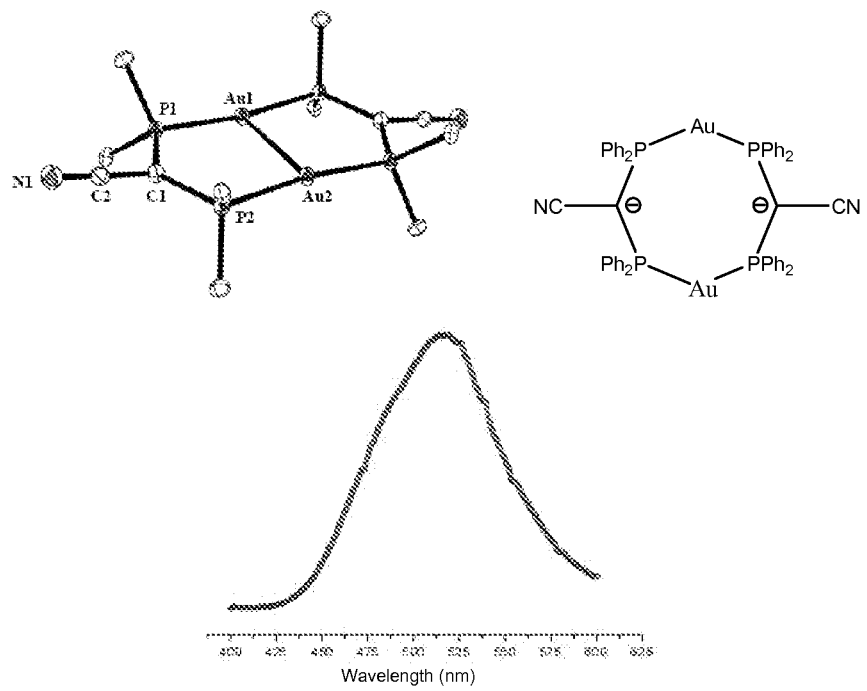
FIG. 9 shows at top left the structure of the dinuclear gold complex (9), determined from X-ray structure data. The structural formula is depicted at top right. The emission spectrum of the complex with an intensity maximum at about 520 nm is shown at the bottom.

FIG. 9 shows at top left the structure of the dinuclear gold complex (9), determined from X-ray structure data. The structural formula is depicted at top right. The emission spectrum of the complex with an intensity maximum at about 520 nm is shown at the bottom.

Figure 10:
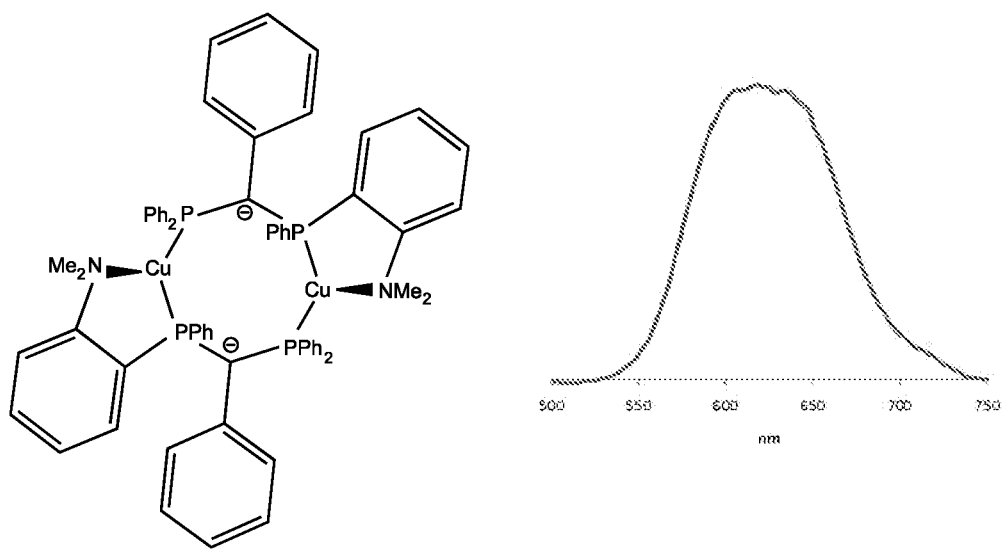
FIG. 10 shows on the left the structural formula of the dinuclear copper complex (10). The emission spectrum of the complex with an intensity maximum at about 620 nm is shown on the right.

FIG. 10 shows on the left the structural formula of the dinuclear copper complex (10). The emission spectrum of the complex with an intensity maximum at about 620 nm is shown on the right.

All these complexes exhibited excellent decay behaviour and were easy to prepare. The general synthetic route is described below with reference to two examples.

Synthesis of the Copper Complex [Cu(Ph$_2$PCPhPPh$_2$)(dppbe)] (3)

Copper amide [Cu(NCH$_2$)$_4$] was initially introduced with one equivalent of the ligand [RCH(PPh$_2$)] in toluene with stirring. The bidentate ligand 1,2-bis(diphenylphosphinobenzene)ethane (dppbe) was subsequently added. After recrystallisation a number of times from toluene, the copper complex (3) was obtained in crystalline form and sent for X-ray structural analysis.

Synthesis of the Copper Complex [Cu$_2$\{PPh$_2$C(Ph)PPh(C$_6$H$_4$NMe$_2$)\}$_2$] (10)

Copper amide [Cu(NCH$_2$)$_4$] was initially introduced with one equivalent of the ligand [Ph$_2$PPhCHPPh(C$_6$H$_4$NMe$_2$)] in toluene with stirring. After this reaction solution had been covered with a layer of n-hexane, the bidentate copper complex (10) was obtained in crystalline form and sent for X-ray structural analysis.

The invention claimed is:

1. An electronic device comprising a metal complex compound having at least one anionic ligand containing two P donors, having the formula I

formula (I)

in which

R$^1$ to R$^4$ are, independently of one another, an atom or radical from the group comprising hydrogen, a halogen, R—, RO—, RS—, RCO—, RCOO—, RNH—, R$_2$N—, RCONR— and —Si(R)$_X$(OR)$_{3-X}$, where R=a C$_1$-C$_{40}$-hydrocarbon and X=1, 2 or 3, and E is a carbon or a boron atom, where if E is a carbon atom, an atom or radical from the group with hydrogen, halogen, —CN, R—, RO—, RS—, RCO—, RCOO—, RNH—, R$_2$N—, RCONR— and —Si(R)$_X$(OR)$_{3-X}$, where R=the C$_1$-C$_{40}$-hydrocarbon and X=1, 2 or 3, is optionally bonded to the carbon, and if E is a boron atom, two radicals from the group with halogen, R—, RO—, RS—, RCO—, RCOO—, RNH—, R$_2$N—, RCONR— and —Si(R)$_X$(OR)$_{3-X}$, where R =the C$_1$-C$_{40}$-hydrocarbon and X=1, 2 or 3, are optionally bonded to the boron.

2. The device according to claim 1, wherein the $C_1$- to $C_{40}$-hydrocarbon R is an alkyl, cycloalkyl, alkenyl, cycloalkenyl, alkynyl, cycloalkynyl, alkylcycloalkyl, heteroalkyl, heterocycloalkyl, heteroalkylcycloalkyl, aryl, heteroaryl, aralkyl or heteroaralkyl radical, each of which may, have one or more halogen, hydroxyl, thiol, carbonyl, keto, carboxyl, cyano, sulfone, nitro, amino and/or imino functions.

3. The device according to claim 1, wherein at least one of the two P is a ring atom of a ring system of an aromatic or non-aromatic nature which includes the radicals $R^1$ and $R^2$ and/or $R^3$ and $R^4$.

4. The device according to claim 1, wherein the metal complex compound is mononuclear or polynuclear.

5. The device according to claim 1, wherein the metal complex compound is mononuclear or polynuclear, and has one to six metal centers.

6. The device according to claim 1, wherein the metal complex compound includes at least one of the metals Cu, Ag, Au, Pd, Pt, Rh, Ir, Re, Os, Mo, W or Zn.

7. The device according to claim 1, wherein the metal complex compound includes at least one of the metals Cu, Ag, Au, Pd, Pt, Rh, Ir, Re, Os, Mo, W or Zn in ionic form.

8. The device according to claim 5, wherein the metal complex compound includes a Cu or Ag ion and at least one further metal from the group with Cu, Ag, Au, Pd, Pt, Rh, Ir, Re, Os, Mo, W or Zn.

9. The device according to claim 1, wherein that the metal complex compound has the formula II

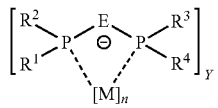

in which
$R^1$ to $R^4$ and E are defined as in formula I,
$[M]_n$ represents a complex fragment where M=at least one metal from the group with Cu, Ag, Au, Pd, Pt, Rh, Ir, Re, Os, Mo, W and Zn,
n is equal to 1 or a higher integer and
y is equal to 1, 2 or 3.

10. The device according to claim 1, wherein the metal complex compound has a ΔE separation between the lowest triplet state and the higher singlet state of between 50 cm-1 and 3000 cm-1.

11. The device according to claim 1, wherein the device is selected from the group consisting of an organic electroluminescent device, a light-emitting electrochemical cell, an organic solar cell, an organic field-effect transistor and an organic laser.

12. The device according to claim 1, wherein the device comprises the metal complex compound as constituent of an emitter layer, where the proportion of the metal complex in the emitter layer is between 0.1 and 50% by weight.

13. The device according to claim 1, wherein the device comprises the metal complex compound as constituent of an absorber layer, where the proportion of the metal complex in the absorber layer is between 30 and 100% by weight.

14. A process for the generation of light of a certain wavelength, comprising the step of the providing a metal complex compound having a ligand containing P donors of the formula I

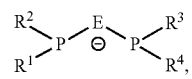

formula (I)

in which
$R^1$ to $R^4$ are, independently of one another, an atom or radical from the group comprising hydrogen, a halogen, R—, RO—, RS—, RCO—, RCOO—, RNH—, $R_2$N—, RCONR—, and —Si(R)$_X$(OR)$_{3-X}$, where R=a $C_1$-$C_{40}$ hydrocarbon and X=1, 2 or 3, and
E is a carbon or a boron atom, where
an atom or radical from the group of hydrogen, halogen, —CN, R—, RO—, RS—, RCO—, RCOO—, RNH, $R_2$N—, RCONR— and —Si(R)$_X$(OR)$_{3-X}$, where R=the $C_1$-$C_{40}$ hydrocarbon and X=1, 2 or 3, is optionally bonded to the carbon, and two radicals from the group of halogen, R—, RO—, RS—, RCO—, RCOO—, RNH—, $R_2$N—, RCONR— and —Si(R)$_X$(OR)$_{3-X}$, where R=the $C_1$-$C_{40}$ hydrocarbon and X=1, 2 or 3, are optionally bonded to the boron.

15. A process for the generation of blue emission which comprises utilizing a metal complex having a compound having a ligand containing P donors of the formula I

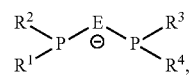

formula (I)

in which
$R^1$ to $R^4$ are, independently of one another, an atom or radical from the group comprising hydrogen, a halogen, R—, RO—, RS—, RCO—, RCOO—, RNH—, $R_2$N—, RCONR—, and —Si(R)$_X$(OR)$_{3-X}$, where R=a $C_1$-$C_{40}$ hydrocarbon and X=1, 2 or 3, and
E is a carbon or a boron atom, where
an atom or radical from the group with hydrogen, halogen, —CN, R—, RO—, RS—, RCO—, RCOO—, RNH, $R_2$N—, RCONR— and —Si(R)$_X$(OR)$_{3-X}$, where R=the $C_1$-$C_{40}$ hydrocarbon and X=1, 2 or 3, is optionally bonded to the carbon, and two radicals from the group of halogen, R—, RO—, RS—, RCO—, RCOO—, RNH—, $R_2$N—, RCONR— and —Si(R)$_X$(OR)$_{3-X}$, where R=the $C_1$-$C_{40}$ hydrocarbon and X=1, 2 or 3, are optionally bonded to the boron.

16. A process for the production of the electronic device according to claim 1, which comprises printing the metal complex compound having the at least one anionic ligand of the formula I

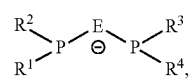

formula (I)

in which
$R^1$ to $R^4$ are, independently of one another, an atom or radical from the group comprising hydrogen, a halogen, R—, RO—, RS—, RCO—, RCOO—, RNH—, $R_2$N—, RCONR—, and —Si(R)$_X$(OR)$_{3-X}$, where R=a $C_1$-$C_{40}$ hydrocarbon and X=1, 2 or 3, and
E is a carbon or a boron atom, where
an atom or radical from the group of hydrogen, halogen, —CN, R—, RO—, RS—, RCO—, RCOO—, RNH, $R_2$N—, RCONR— and —Si(R)$_X$(OR)$_{3-X}$, where R=the $C_1$-$C_{40}$ hydrocarbon and X=1, 2 or 3, is optionally bonded to the carbon, and two radicals from the group of halogen, R—, RO—, RS—, RCO—, RCOO—, RNH—, $R_2$N—, RCONR— and —Si(R)$_X$(OR)$_{3-X}$, where R=the $C_1$-$C_{40}$ hydrocarbon and X=1, 2 or 3, are optionally bonded to the boron onto a substrate.

* * * * *